(12) United States Patent
Mulcahy et al.

(10) Patent No.: US 7,719,405 B2
(45) Date of Patent: May 18, 2010

(54) CROSSPOINT SWITCH WITH LOW RECONFIGURATION LATENCY

(75) Inventors: Daniel J. Mulcahy, Somerville, MA (US); Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 977 days.

(21) Appl. No.: 11/011,560

(22) Filed: Dec. 14, 2004

(65) Prior Publication Data

US 2006/0126606 A1    Jun. 15, 2006

(51) Int. Cl.
*H04Q 3/00* (2006.01)

(52) U.S. Cl. .................. 340/2.21; 340/2.1; 340/14.1; 340/3.1

(58) Field of Classification Search ............... 340/2.21, 340/2.1, 2.2, 2.27, 2.24, 14.1, 3.1; 326/27, 326/83; 370/386, 465, 390

See application file for complete search history.

(56) References Cited

U.S. PATENT DOCUMENTS 4,371,789 A * 2/1983 Chen et al. ............... 307/38
4,833,670 A * 5/1989 Lebizay et al. ............ 370/383
5,777,505 A * 7/1998 LaRue ...................... 327/407
6,510,525 B1 * 1/2003 Nookala et al. ........... 713/324

* cited by examiner

*Primary Examiner*—Vernal U Brown
(74) *Attorney, Agent, or Firm*—Sunstein Kann Murphy & Timbers LLP

(57) ABSTRACT

A method of operating a circuit for processing a digital signal is disclosed. The circuit includes various circuit stages having respective enabled states. A present signal path is established which includes circuit stages in their respective enabled states. Power is disabled to selected circuit stages not used in the present signal path so as to minimize power consumption in the disabled circuit stages. A data signal is then processed through the circuit stages in the present signal path. Before a next signal path is needed, power is re-enabled to selected disabled circuit stages in the next signal path to allow the enabled circuit stages to approach their respective enabled states. Then the next signal path can be established including the enabled circuit stages in their respective enabled states. The data signal can then be processed through the circuit stages in the next signal path.

9 Claims, 5 Drawing Sheets

CROSSPOINT SWITCH WITH LOW RECONFIGURATION LATENCY

FIELD OF THE INVENTION

The invention generally relates to data switching circuits, and more specifically to a crosspoint switch for such circuits.

BACKGROUND OF THE ART

One example of a high speed digital circuit is a crosspoint switch, which can selectably connect data signals between multiple inputs and multiple outputs. FIG. 1 shows a slice of such a crosspoint switch showing a single path connecting one input port to one output port. The crosspoint switch can be conceptually divided into a high-speed data path (shown by thin lines in FIG. 1) and a lower-speed control plane that determines connectivity (shown by thick lines in FIG. 1). The control plane is run by a digital clocking signal and determines which pieces of the data path should be enabled for a given connectivity and when the enabling signals should change. For the switch control plane, connectivity data to control the data path may be written into control latches or flip-flops.

In FIG. 1, a first stage buffer 11 provides a high impedance input (with reduced input capacitance) and converts signal levels. Driving four sets of input lines from each of the second stage input buffers 12 reduces the number of point cells 13 loading each input by a factor of four. Groups of multiple point cells are provided to first stage multiplexers 14 to allow the associated data streams to be directed to a second stage multiplexer 15 driving a selected output port. The capacitance load on each point cell 13 is reduced by collecting multiple first stage multiplexers 14 for each second stage multiplexer 15. The second stage multiplexer 15 may also act as an output buffer.

However, circuits such as the crosspoint switch shown in FIG. 1 draw relatively high power and may have limited speed in a given process technology. To reduce power consumption, inactive circuit stages may be powered down or disabled and stages may be activated only when needed. This disabling tends to create uneven propagation delays through the path depending on when in a given cycle connectivity is updated. When an inactive stage is reactivated, the time it takes the stage to reach its enabled state increases the propagation delay through the data path. This increased propagation delay sets the largest delay condition and determines the maximum operating frequency of the data path.

SUMMARY OF THE INVENTION

A representative embodiment of the present invention includes techniques for low-power high-speed digital communications applications having a low reconfiguration latency. A digital circuit includes various circuit stages having respective enabled states. A present signal path is established which includes circuit stages in their respective enabled states. Power is disabled to selected circuit stages not used in the present signal path so as to minimize power consumption in the disabled circuit stages. A data signal is then processed through the circuit stages in the present signal path. Before a next signal path is needed, power is re-enabled to selected disabled circuit stages in the next signal path to allow the enabled circuit stages to approach their respective enabled states. Then the next signal path can be established including the enabled circuit stages in their respective enabled states. The data signal can then be processed through the circuit stages in the next signal path.

In further embodiments, these steps may repeat at least once, or in a recurring cycle of power control. The circuit stages may use current mode logic or Complementary Metal Oxide Semiconductor (CMOS) logic. The selected disabled circuit stages may be one or more input buffers in a multistage digital circuit.

Embodiments also include devices adapted to use any of the above techniques, including a multiplexer or a crosspoint switch.

DETAILED DESCRIPTION OF SPECIFIC EMBODIMENTS

Embodiments of the present invention are directed to techniques for low power digital switching devices with low reconfiguration latency suitable for high speed applications. In some applications, a data path may be a cascade of multiple circuit stages, some of which may be enabled simultaneously without creating contention at the output. Thus, selected circuit stages in a given data path may be enabled before they are need (pre-warmed) during circuit reconfiguration, thereby minimizing reconfiguration-related delays. By reducing latency, the data path can operate at higher data rates while maintaining low power consumption. The propagation delay of a given data path can be improved by pre-warming, or enabling early, stages at the beginning of the data path. Pre-warming these stages reduces the propagation time of the stages by absorbing some or all of the time it takes each stage to reach its enabled state.

Thus, in various embodiments of the present invention there initially is a present signal path through a high speed digital device having various circuit stages which operate at their respective enabled states. To reduce power consumption by the device, power is disabled to selected inactive circuit stages. This allows the remaining active circuit stages to process a signal through the device along the present signal path. Before the circuit is reconfigured to a next signal path, power is reapplied to selected disabled circuit stages to allow them to approach their respective enabled states. Then the device is ready to establish the next signal path including the re-enabled circuit stages already at their respective enabled states. Once the next signal path has been established, the device is ready to process the signal through the circuit stages in the next signal path. Once again power may be disabled to any inactive circuit stages. The circuit stages may use current mode logic or Complementary Metal Oxide Semiconductor (CMOS) logic.

Figure 2:
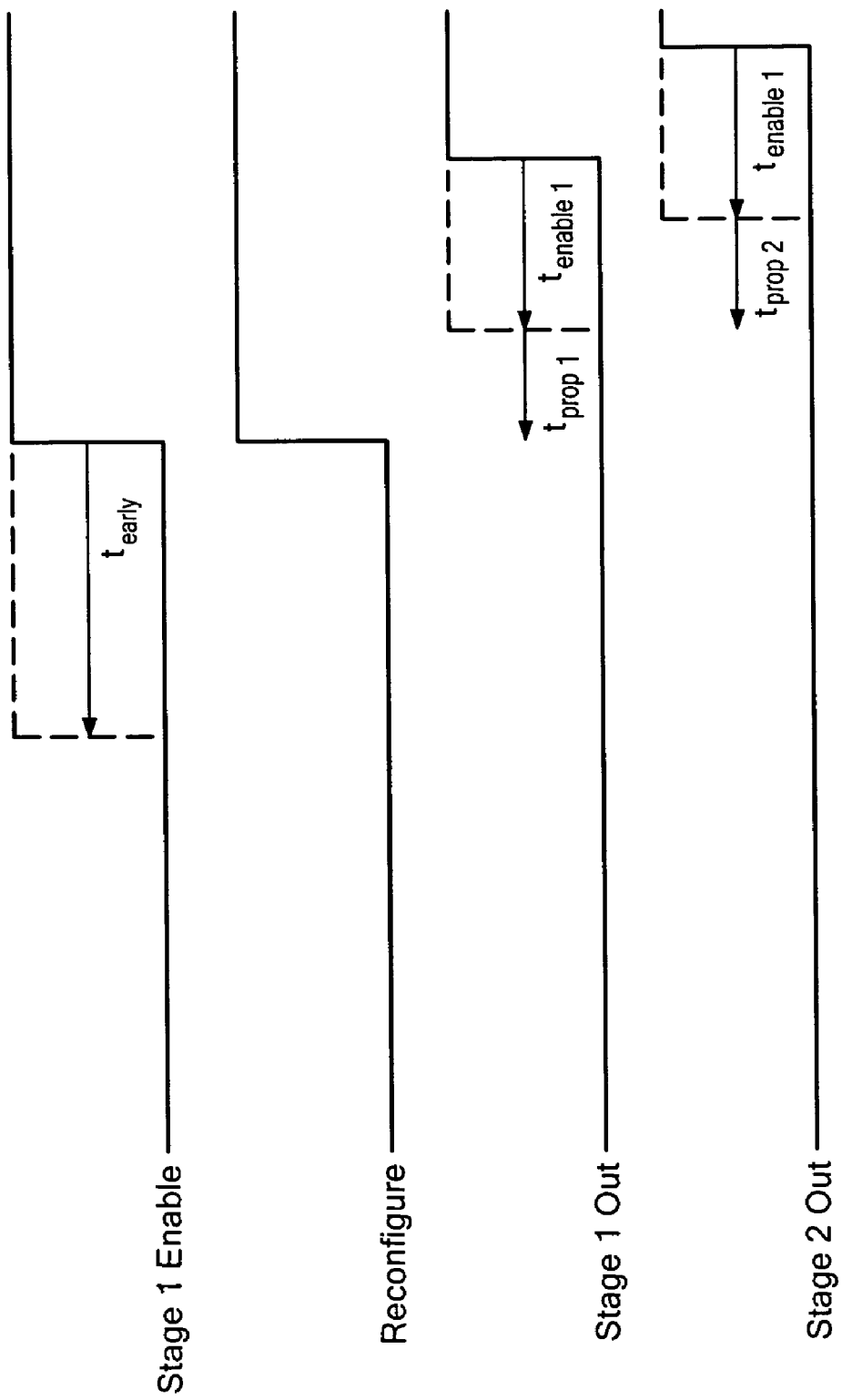
FIG. 2 shows the effects of pre-warming on the propagation delay through one or more stages of one specific embodiment of the present invention.

FIG. 2 shows the effects of pre-warming on the time it takes for a given stage to reach its enabled state. The solid lines represent circuit response without pre-warming and the dashed lines represent circuit response with pre-warming. As seen in the top two waveforms, without pre-warming Stage 1_Enable is enabled synchronously with the Reconfigure signal that reconfigures the data path. This results in the Stage 1_Out responding at some later time representing the combined effect of the stage propagation delay, $t_{prop1}$, and the additional propagation delay from the stage reaching its enabled state, $t_{enable}$. This is shown by the solid vertical edge in the Stage 1_Out waveform. By pre-warming the stage some amount of time $t_{early}$ (shown by the dashed line in the Stage 1_Enable waveform), the time for the Stage 1_Out to respond can be decreased down to just the propagation time, $t_{prop}$, when $t_{early} > t_{enable}$. If the Stage 1 propagation time, $t_{prop\_stage1}$, is greater than the time it takes for the next stage to reach its enabled state, $t_{enable\_stage2}$, then pre-warming the first stage will remove all of the $t_{enable}$ delay from the path propagation delay. However, if $t_{prop\_stage1} < t_{enable\_stage2}$, then removing all of the $t_{enable}$ delay requires pre-warming more than one stage, with benefits continuing as long as $t_{enable} > \Sigma_{prev\_stages} t_{prop}$.

Figure 1:
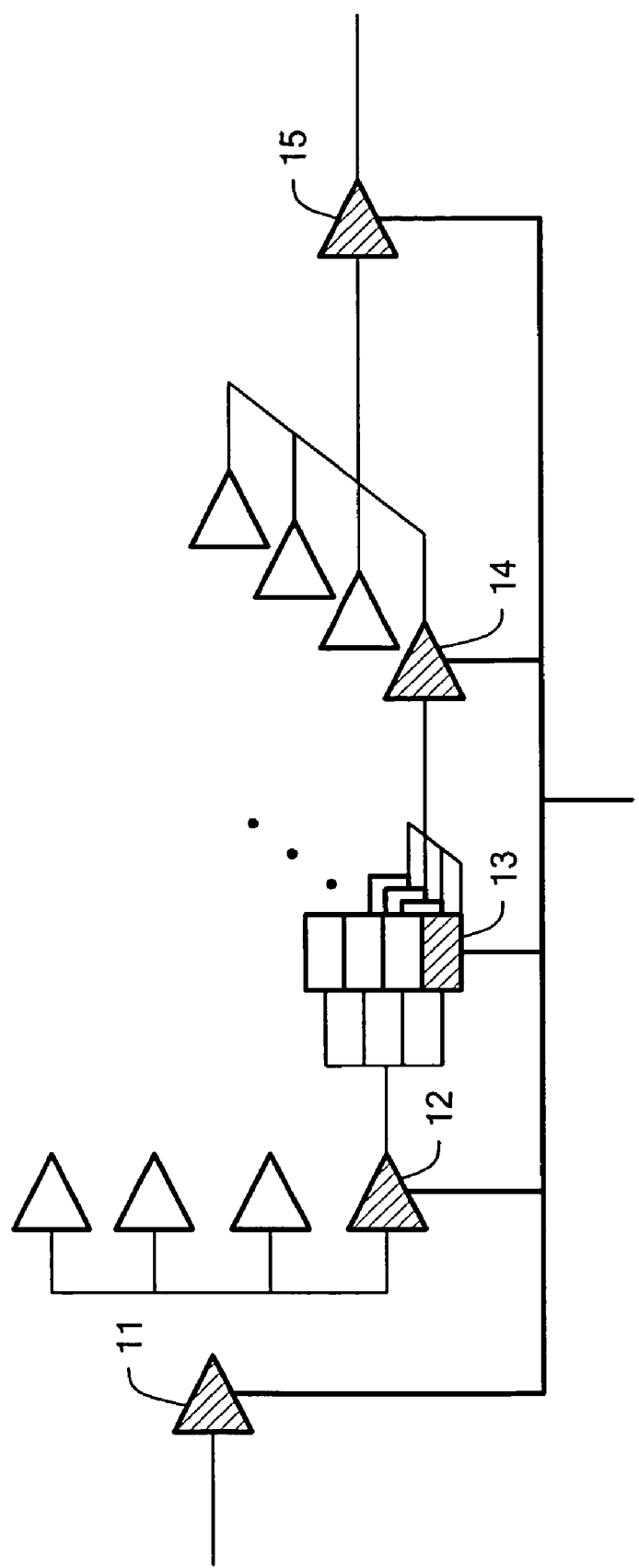
FIG. 1 shows a slice of a crosspoint switch showing a single path connecting one input port to one output port.

Pre-warming can be applied to the stages in a crosspoint switch such as the one shown in FIGS. 1 and 2. In order to allow connectivity from every input to every output, the first stage buffer 11 and second stage buffers 12 have fan-outs greater than one to get each input to each of N outputs. Since the outputs of these buffers are not shared, any number of them can be enabled without causing contention at their outputs. Thus, these first two stages are candidates for pre-warming. The point cells 13, first stage multiplexers 14 and second stage multiplexer 15 perform a two level multiplexing operation to collect the signals from all inputs to each output. Typically, this multiplexing operation may be implemented as a wired OR gate with the enable for the point cells 13 and the first stage multiplexers 14 performing the selection. For that reason, enabling more than one point cell 13 or first stage multiplexer 14 would cause contention at their outputs. Thus, these stages would not be considered for pre-warming. With respect to FIG. 2, pre-warming allows more complete separation between the high-speed data plane (thin lines) and low-speed control plane (thick lines) by removing residual delay from the control plane from total delay through the data plane.

Figure 3:
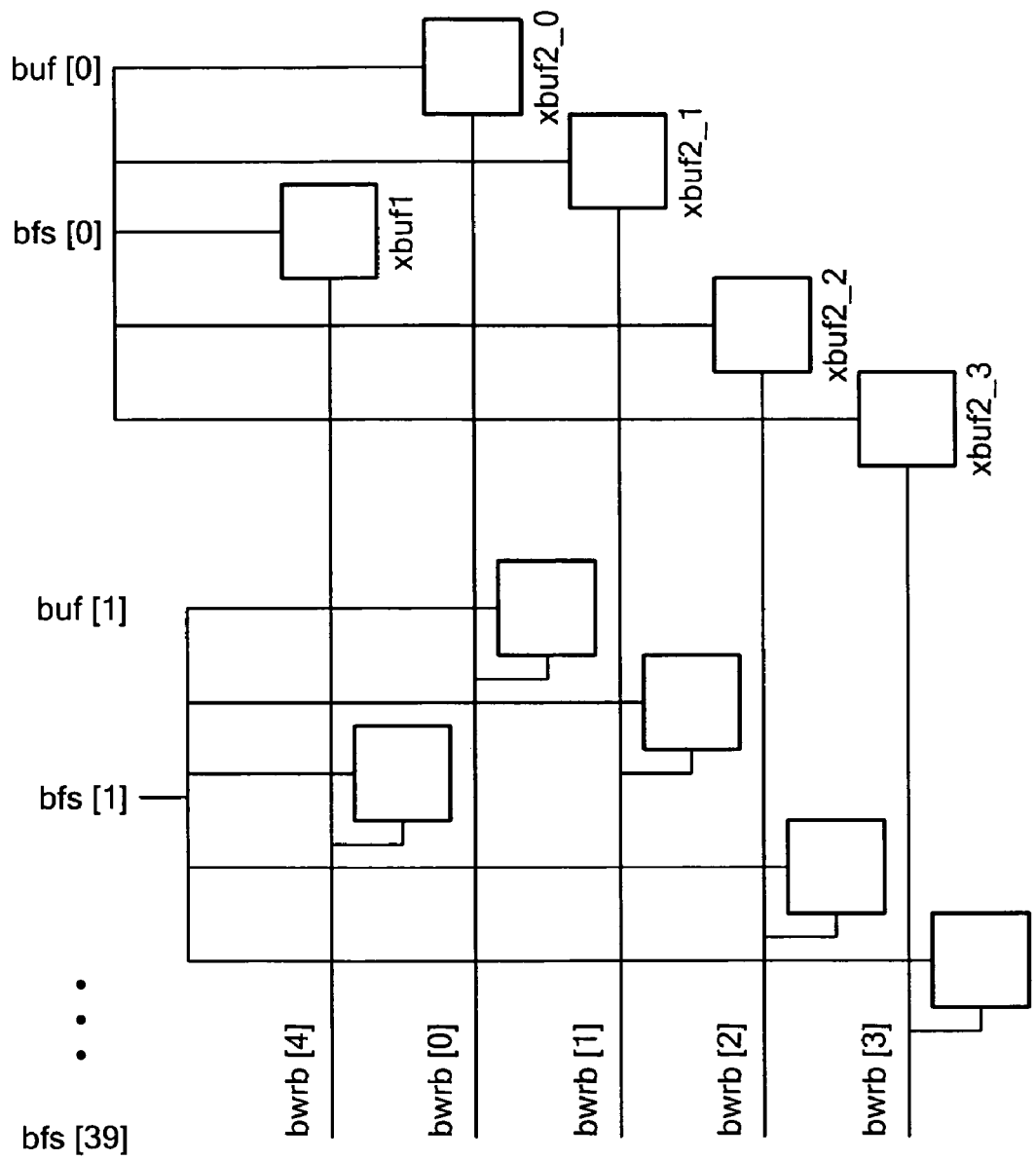
FIG. 3 shows some of the functional structure of the first and second stage buffers in one specific embodiment using double-buffered latches.
Figure 4:
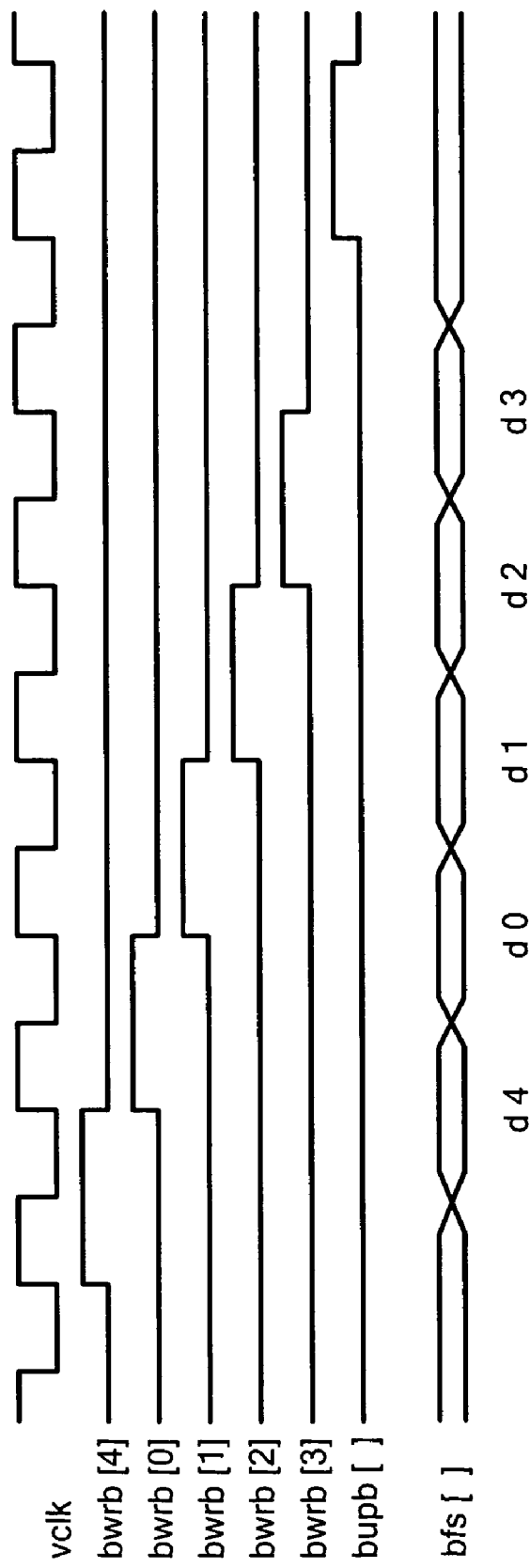
FIG. 4 shows various signal waveforms associated with the embodiment shown in FIG. 3.

FIG. 3 shows some of the functional structure of the first and second stage buffers in one typical specific embodiment using double-buffered latches. FIG. 4 shows various associated signal waveforms. For the first input bfs[0], the corresponding input buffer buf[0] has a single first stage buffer, xbuf1, which fans out to four second stage buffers xbuf2_# (#=0-3). Five write enable strobe signals, bwrb[0-4] are shared as shown by all 40 of the inputs bfs[0-39]. Not shown are the connectivity data lines between the first stage buffer xbuf1 and the second stage buffers xbuf2_#. Asserting only one of the write enables at a time may avoid the need for each of the five buffer blocks per input to need its own data. This takes five clock cycles to program. In the first cycle, all of the xbuf1's are programmed at once. In the second cycle, all of the xbuf2_0's are programmed, etc. Each input also has a single second rank write enable signal (upb[0-39]) that strobes all five buffer stages. Thus, connectivity data is written into double-buffered latches with one set (one first rank bit and one second rank bit) for every buffer, point cell and multiplexer in the array. If the data in the second rank is a 1, the cell is enabled, if it is a 0, the cell is disabled. Although FIG. 3 shows use of latches, specific embodiments of the invention work equally well in other circuits such as flip-flops.

By enabling the buffers early, the propagation delay of the first rank buffers is reduced from $t_{prop}+t_{enable}$ to $t_{prop}$ since in this case the period of the connectivity clock domain is longer than $t_{enable}$ of the buffer. As previously stated, further savings could have been achieved if $t_{enable\_stage2} > t_{prop\_stage1}$ by additionally pre-warming the second rank buffers. Since the input buffer blocks are enabled at least one clock cycle before the point cells and output multiplexers are enabled, the update occurs after both the old data has been clocked out of the crosspoint by the second rank multiplexers, and after the new data has been clocked into the crosspoint by the first stage buffer, which was enabled early. Once the update occurs, the new data path buffers, point cells, and multiplexers are enabled and the new data, waiting at the output of the first stage buffers is passed through the crosspoint.

Figure 5:
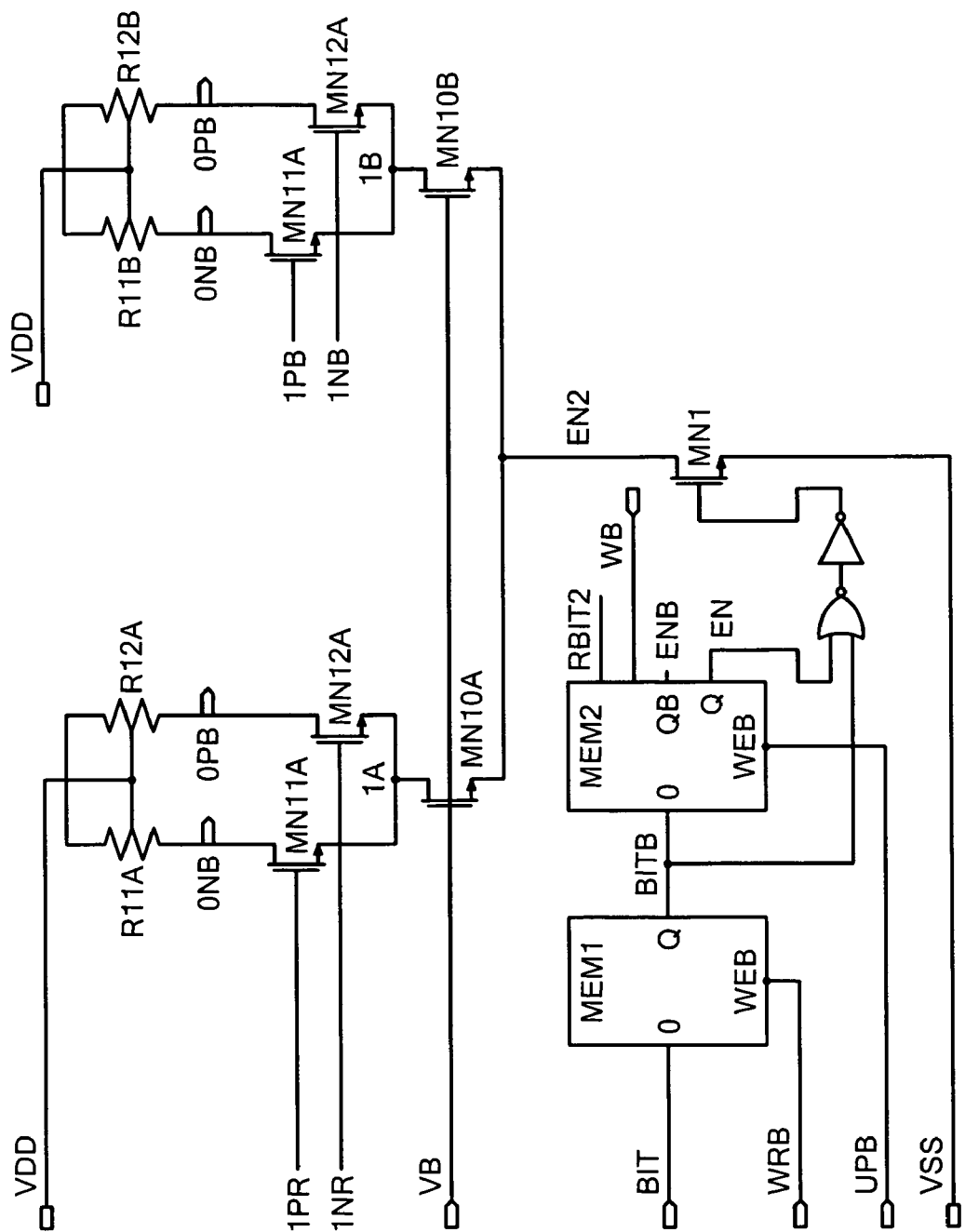
FIG. 5 shows one specific circuit arrangement of a first stage input buffer.

FIG. 5 shows one specific circuit arrangement of a first stage input buffer. The output of the first and second stage latches can be OR-ed together to create the early enable signal, $t_{early}$, for these buffers. This OR-ing enables the buffers at least one clock cycle before the update signal that makes them part of an active path, giving them more than enough time to reach a stable enabled state. The OR operation occurs in the control plane at the bottom of FIG. 5 where the signals EN and BITB are OR-ed together to create signal EN2. The signal BITB represents the control data that will be applied to the stage when the reconfiguration signal (UPB) is asserted. In the prior art, this data would not get through to the stage until the reconfiguration signal was asserted (at least one clock cycle after the data arrived at BITB). With pre-warming, the OR operation allows the control data to enable the stage when it arrives without waiting for the reconfiguration signal so that the stage is pre-warmed by the amount of time between the data assertion and the reconfiguration assertion. An OR gate is used in this embodiment such that when enabling the stage BITB will allow early enable (as this goes high before reconfiguration). When disabling the stage EN will maintain the stage enabled until reconfiguration occurs (BITB will go low before reconfiguration, but the stage should not turn off early).

Although various exemplary embodiments of the invention have been disclosed, it should be apparent to those skilled in the art that various changes and modifications can be made which will achieve some of the advantages of the invention without departing from the true scope of the invention.

What is claimed is:

1. A method of operating a circuit for processing a digital data signal, the circuit including a plurality of circuit stages having respective enabled states, the method comprising:
   (a) establishing a present signal path including a plurality of circuit stages in enabled states;
   (b) disabling power to selected circuit stages not used in the present signal path so as to minimize power consumption in the disabled circuit stages;
   (c) processing a digital data signal through the circuit stages in the present signal path controlled by a digital clocking signal;
   (d) while processing the digital data signal through the present signal path, enabling power to selected disabled circuit stages in a next signal path to allow the enabled circuit stages to approach their respective enabled states;
   (e) at least one cycle of the clocking signal after enabling power to the selected disable circuit stages, establishing the next signal path including the enabled circuit stages in enabled states; and
   (f) processing the digital data signal through the circuit stages in the next signal path.

2. A method according to claim 1, further comprising:
   (g) repeating steps (b)-(f) at least once.

3. A method according to claim 1, further comprising:
   (g) repeating steps (b)-(f) in a recurring cycle.

4. A method according to claim 1, wherein the circuit stages use current mode logic.

5. A method according to claim 1, wherein the circuit uses Complementary Metal Oxide Semiconductor (CMOS) logic.

6. A method according to claim 1, wherein the selected disabled circuit stages are one or more input buffers in a multistage digital circuit.

7. A device adapted for using the method according to any of claims 1-5.

8. A device according to claim 7, wherein the device is a multiplexer.

9. A device according to claim 7, wherein the device is a crosspoint switch.

* * * * *